(12) United States Patent
Sasov (10) Patent No.: US 6,263,563 B1
(45) Date of Patent: Jul. 24, 2001

(54) METHOD OF MANUFACTURING AND CHECKING ELECTRONIC COMPONENTS

(75) Inventor: Yuriy Dmitrievich Sasov, Moscow (RU)

(73) Assignee: R-Amtech International, Inc., Bellevue, WA (US)

( * ) Notice: Subject to any disclaimer, the term of this patent is extended or adjusted under 35 U.S.C. 154(b) by 0 days.

(21) Appl. No.: 09/119,240

(22) Filed: Jul. 21, 1998

(30) Foreign Application Priority Data

Nov. 3, 1997 (RU) .............................. 97 117 558

(51) Int. Cl.$^7$ ................................... H01R 43/00
(52) U.S. Cl. ................. 29/827; 29/830; 29/832; 29/837
(58) Field of Search ............................. 29/825, 827, 833, 29/626, 407.1, 840, 630; 438/111, 121, 123; 257/666–667

(56) References Cited

U.S. PATENT DOCUMENTS

| 3,725,744 | 4/1973 | Reed | 317/101 CC |
| 3,805,117 | 4/1974 | Hausman | 317/101 |

(List continued on next page.)

FOREIGN PATENT DOCUMENTS

| 42 04 459 A1 | 8/1993 | (DE) . |
| 42 32 404 A1 | 3/1994 | (DE) . |
| 195 07 547 C2 | 9/1996 | (DE) . |
| 0 287 451 | 10/1988 | (EP) . |
| 0 287 451 B1 | 10/1988 | (EP) . |
| 427 328 A2 | 5/1991 | (EP) . |
| 465 195 A2 | 1/1992 | (EP) . |
| 554 622 A2 | 8/1993 | (EP) . |
| 0 673 193 | 9/1995 | (EP) . |
| 673 193 A1 | 9/1995 | (EP) . |
| 2 153 144 | 8/1985 | (GB) . |
| 63-65632 | of 1988 | (JP) . |
| WO 91/10259 | 7/1991 | (WO) . |

OTHER PUBLICATIONS

JP 4–23975 A., IN: Patent Abstracts of Japan, E–1302, Jan. 7, 1993, vol. 17, no. 6.

Daum, Wolfgang, Burdick, William E.: Minimal IC Pretest Requirements for Multichip Modules. In: IEEE Transactions on Components Packaging and Manufacturing Technology, Part. B, vol, 17, No. 3, Aug. 1994.

Primary Examiner—Lee Young
Assistant Examiner—Sean Smith
(74) Attorney, Agent, or Firm—Birch, Stewart, Kolasch & Birch, LLP (57) ABSTRACT

The invention relates to electronic technique, particularly to technology of fabricating and checking semiconductor integrated circuits and semiconductor structures. The method of manufacturing and checking electronic components consists in that a plurality of dice are disposed in a press-form, orienting to the dice bonding pads and base elements of the press-form, all non-protected surfaces of the dice except the bonding pads are insulated. Specificity of the method consists in that disposing in the press-form dice are fixed one to another forming a group carrier, providing a disposal of the dice facial (main) surfaces on common plane with one of the group carrier's surfaces, at that all the conductors, necessary for burn-in and checking, and also external connector are deposited on this plane simultaneously. Variants of the method consist in that a group metal frame is disposed simultaneously with the dice. The group carrier can be also formed by a flexible printed circuit board, connected to a hard base.

12 Claims, 5 Drawing Sheets

U.S. PATENT DOCUMENTS

| | | |
|---|---|---|
| 4,242,720 | 12/1980 | Moore . |
| 4,246,595 | 1/1981 | Noyori et al. . |
| 4,572,981 | 2/1986 | Zola ..................................... 310/357 |
| 4,628,406 | 12/1986 | Smith et al. ............................ 36/386 |
| 4,924,353 | 5/1990 | Patraw . |
| 4,981,817 | 1/1991 | Stone, Jr. . |
| 4,996,630 | 2/1991 | Liguori et al. ....................... 361/412 |
| 5,118,369 | 6/1992 | Shamir ................................... 156/64 |
| 5,129,974 | 7/1992 | Aurenius ............................... 156/64 |
| 5,322,446 | 6/1994 | Cearley-Cabbines et al. . |
| 5,399,505 * | 3/1995 | Dasse et al. ............................. 437/8 |
| 5,440,240 | 8/1995 | Woods et al. ......................... 324/765 |
| 5,451,165 | 9/1995 | Cearley-Cabbines et al. . |
| 5,517,036 | 5/1996 | Semba et al. . |
| 5,532,612 | 7/1996 | Liang .................................... 324/760 |
| 5,532,614 | 7/1996 | Chiui . |
| 5,570,032 | 10/1996 | Atkins et al. ......................... 324/760 |
| 5,600,101 | 2/1997 | Sakai .................................... 174/261 |
| 5,640,762 | 6/1997 | Farnworth et al. .................... 29/833 |
| 5,696,033 | 12/1997 | Kinsman .............................. 437/217 |
| 5,831,445 | 11/1998 | Atkins et al. ......................... 324/760 |

\* cited by examiner

METHOD OF MANUFACTURING AND CHECKING ELECTRONIC COMPONENTS

Invention relates to electronic technique, particularly, to the technology of fabrication semiconductor integrated circuits.

Creating the electronic components conventionally includes besides manufacture of semiconductor structure very labor-consuming processes- burn-in and final inspection of manufactured dice after their packaging. The cost of these processes often many times exceeds the cost of IC dice manufacture. Necessity of contacting sockets applying additionally aggravate situation, because it makes necessary to produce these thousands complicated devices using precious metals but having low reliability.

It is know technical decision in the international claim WO 91/10259 HO1L 21/66 dt. Dec. 26, 1989. <<Testable ribbon bonding method and wedge bonding for microcircuit device fabrication>>.

An electrical circuit component is temporarily fixed to a temporary substrate. Electrical contacts on the component are interconnected with corresponding contacts on the test substrate by lead wires or ribbons ,using a bonding merge that forms the lead wires into a gull-wiring shape with central portions thereof formed adjacent to portions of the component. The component is subjected to a test procedure while fixed to the temporary substrate via signals applied to the contacts thereof. The lead wires are then severed near their connection to the temporary substrate, and the component with the remaining attached lead wire portions is removed from the test substrate. The lead wires are sufficiently stiff and or are adhered to the edge portions of the component with an adhesive so as retain their shapes after removal of the component from the temporary substrate. The components is then adhered to a permanent device substrate, and the ends of the lead wires are bonded to corresponding contacts on the device substrate.

It is also known decision in Europatent EP0287451 HOL 21/66 (Oct. 19, 1988) <<Method and device for connection and Mounting Electronic Component During Tests>>.

The method provides component's connection with a frame, disposed around a periphery of component by the means of wire conductors.

The component's test is made by connecting test equipment with the said frame. After testing the component is being mounted in a substrate, and component's connection with the substrate is implemented by conductors, connecting the components with the frame. After the connection the conductors are cut between bonding pads on the substrate and the frame. After it the frame is removed.

Both said above methods allow to make group IC dice checking before a final packaging. A shortcoming of these methods is that they don't decide a problem of burn in process, additionally it is necessary to provide preliminary contacting leads with the bounding pads of the die, that is labor-consuming consecutive operation.

Constructive decision in U.S. Pat. No. 3,725,744 HO5K 1/04 (Jun. 11, 1971) <<Electical Component Connector Assembly>> allows not only to check electronic components, but to use the construction as 3-D modules assembly.

An assembly for electrically connecting various miniaturized electrical components is disclosed and generally includes a planar surface, such as a motherboard, which supports the electrical components as well as at least one thin insulating strip lying in a plane extending perpendicular to the surface and defining a plurality of apertures arranged in accordance with a predetermined circuit plan. A plurality of spaced-apart electrically conductive posts and at least one electrically conductive rail are mounted on opposite sides of the insulating strip and extend in transverse directions so as to cross the aforesaid apertures in accordance with the predetermined plan. In this manner, preselected posts are welded to preselected rails through commonly crossed apertures, and are also electrically connected to the various electrical components which thereby connect these components together in accordance with the aforestated predetermined circuit plan.

Shortcomings of this method are labor-consuming of electronic components primary mounting and complexity of extracting the defected component.

It is known also a technical decision in U.S. Pat. No. 4,996,630 HO5K 1/11 (Jun. 22, 1993) <<Hybrid Module Electronics Package>>.

A very Large Hybrid Module for packaging electronic components provides a hermetic enclosure formed by a hermetic substrate on which the components are mounted together with a hermetic lid surrounding groups of the components. A second substrate outside the hermetic enclosure is utilized for providing connections between the electronic components The said technical decision is oriented, mainly, to a creating hybrid IC, but it can be used for unpackaged component's checking before a hermetic lid mounting.

The being proposed <<Method of Manufacturing and Checking Electronic Components>> consists, in particular, in that the burn-in is processed simultaneously for all the dice, preliminarily molded in press-form. A group metal frame with the leads for each die can be disposed in the press-form, the frame is fixed simultaneously with the dice forming the group carrier.

Implementation of burn-in and checking according to the invention of all dice simultaneously allows significantly decrease the duration of assembling and checking electronic component.

Above mentioned technical decisions in Europatent 0287451 and international claim WU 91/10259 are the most like to the being claimed <<Method of Manufacturing and Checking Electronic Components>>.

The present invention consists in that in the method of manufacturing and checking electronic components, including disposal the plurality of dice on the group carrier, electrical connection with it, implementation the group burn-in and checking of the dice and further extracting the good dice from the group carrier, according to the invention, the dice are disposed inside the press-form, orienting to their bonding pads and base elements of the press-form; the dice are fixed one to another mainly using a polymeric material, creating the group carrier, at the same time providing a disposal of main dice surfaces on the common plane with one of the group carrier surfaces; an insulating layer is deposited to all electrically non-protected the dice zones: conductors, connecting the bonding pads of the dice with external contacts, conductors, connecting the dice one to another and with external connector are deposited simultaneously to the common surface of the group carrier and dice, these conductors providing the implementation of the burn-in and checking simultaneously form the external connector of the group carrier; the good dice together with separate zones of the carrier are detached from the group carrier, and then obtained electronic component is housed into package.

It is possible to dispose simultaneously to the press-form not only the dice, but additionally a group metal frame with leads for every die, the frame in this case is fixed simultaneously with the dice forming the group carrier, besides it the frame's leads are disposed on the same plane with the main surfaces of dice. In order to make further operations windows with opening the frame's leads, intended for further connection with the dice bounding pads are provided in the group carrier, and also windows with opening and further removing parts of the group frame, locking external contacts of components are formed in the carrier too. Moreover, in this case there is a danger of components damage by a static electricity. Therefore, all further operations must be implemented using protection of the static electricity (electrostatic discharge). After these operations good components are detached from the group carrier, the external leads are moulded, hermetization using polymeric material is made, and the components are used as integrated circuits (IC), housed in polymeric (epoxy) packages.

A variant, when the group frame is not applied, is possible too. In this case the external leads of the components are formed by the means of through metallized apertures (vias) in the group carrier. After burn-in processing and checking the good components are detached from the group carrier, hermetization by polymeric material is made further, the components are used as IC, housed in polymeric package.

The group carrier can be implemented as a flexible printed circuit board (PCB), the dice being electrically connected to the board, and conductors being deposited on the board, connecting the dice one to another and with an external connector of the group carrier, external connector being formed by the means of rounding the flexible PCB around one of borders of the group carrier's hard base and fastening the flexible PCB to the base using, for example, gluing. In this case through apertures are made in the group carrier's hard base, providing detaching the good die with PCB zones, necessary for further applying the electronic component.

In variant without the frame good components can be used after detaching from the group carrier as known good for conventional method of assembling, in this case forming external contact leads is not implemented.

FIGS. 1–10 shows variants of device, realizing the method of manufacturing and checking electronic components:

Plurality of semiconductor dice is disposed in the tooling (press-from), orienting to the bonding pads of the dice 1 and base element's of the press-form.

In one of the variants (FIG. 1) simultaneously the group frame 2 is housed into the press-form, orienting it to the same base elements of tooling. The frame 2 is manufactured according a mutual disposal of the dice inside the press-form. In this case the dice 1 must be disposed in windows, formed by leads 4 of the frame 2. Forming the group carried 3 is made so, that the dice 1 and the leads 4 of the group frame 2 have a common plane with one surfaces of the carrier 3.

Figure 1:
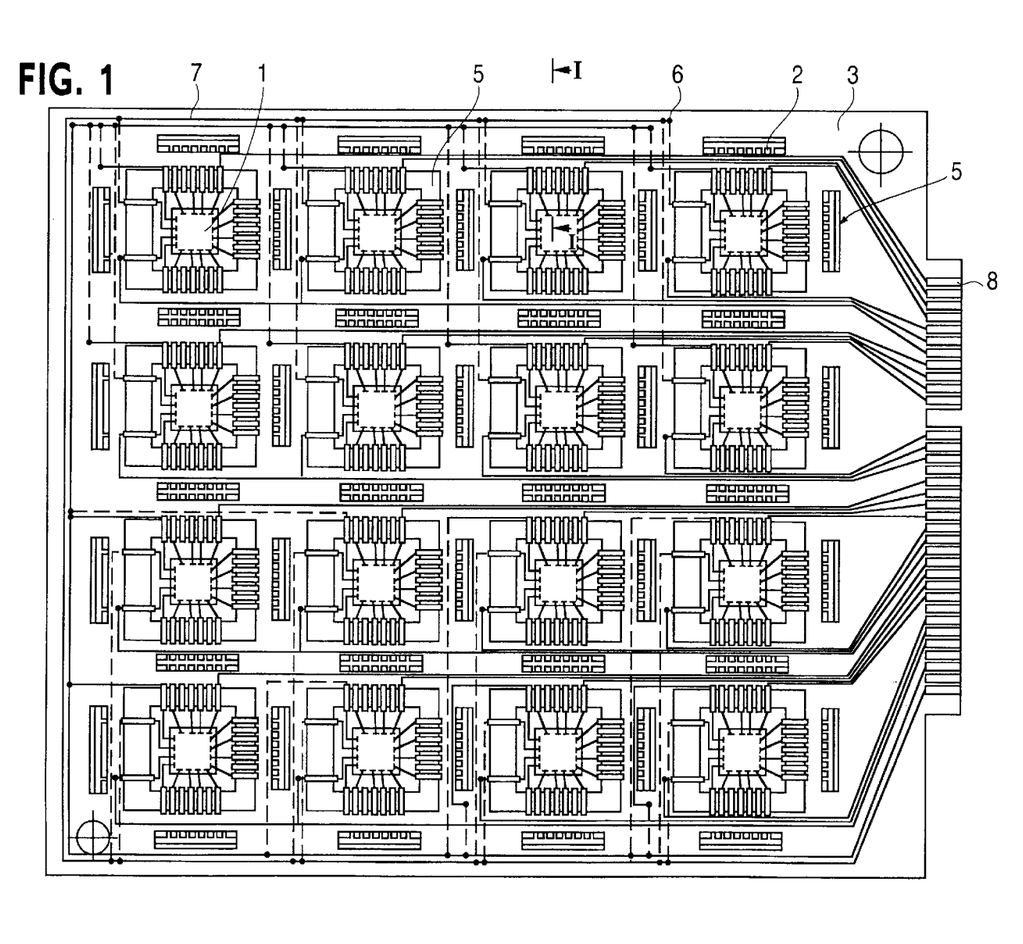
FIG. 1. Variant of framed group carrier.
Figure 1A:
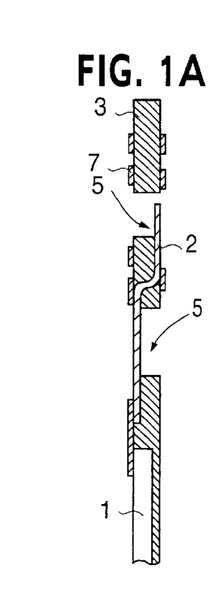

Simultaneously windows 5, opening zones of connection the leads 4 with the frame 2 and windows, realizing an access to the windows 4 are provided in the carrier 3. Apertures 6 for further connection of conductors, disposed on the opposite sizes of the carrier 3, are made in carrier too. The carrier's 3 shape also provides a zone of future flat connector 8 and necessary elements of hardness 9 of the group carrier 3.

After forming the group carrier 3 conductors 7 are simultaneously deposited, mainly by the means of vacuum deposition, on a main surface of the carrier, main surface of the carrier, main surfaces of all dice 1 and the leads 4. Simultaneously the flat connector 8 of the group carrier 3 is formed, and necessary for burn-in dice checking conductors 7 are also deposited.

All connections are deposited by a common technological operation, for example, be the vacuum conductors deposition using a free mask. If it is necessary, the conductors 7 are deposited on the opposite side of the carrier 3 too.

After it zones of connection between leads 4 and the frame 2 are removed though the windows 5 by the means, for example, of cutting using a punch, disconnecting electrically the leads 4 one from another. Then the carrier goes to burn-in and checking.

Figure 2:
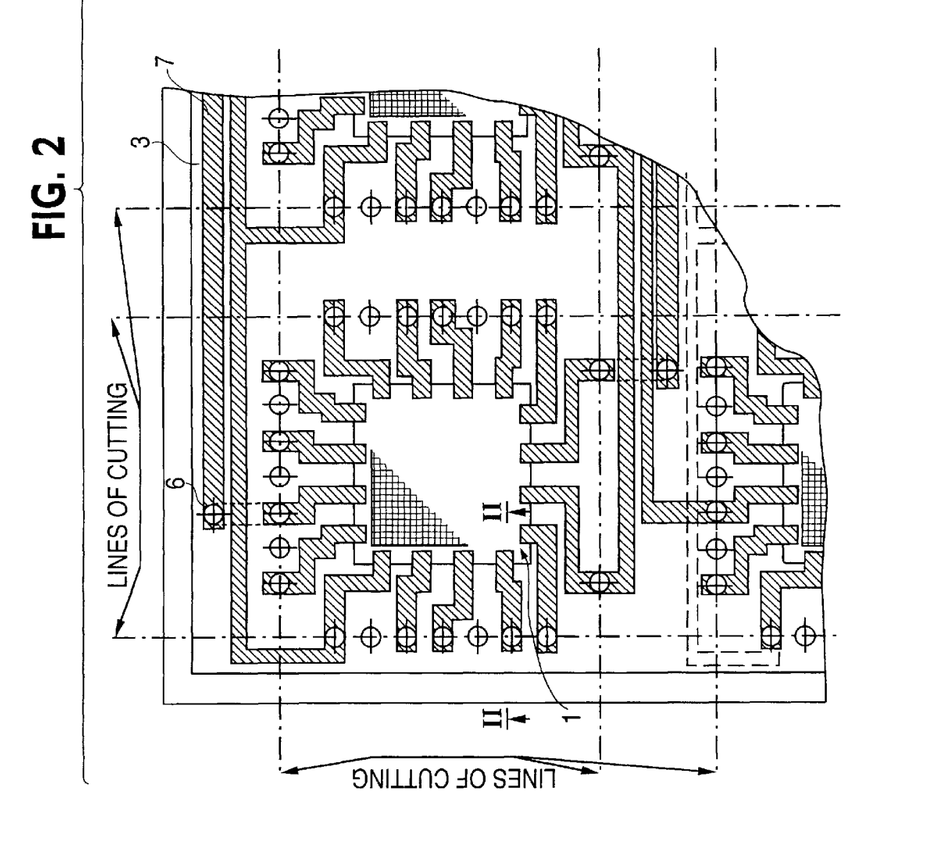
FIG. 2. A fragment of unframed group carrier
Figure 2A:
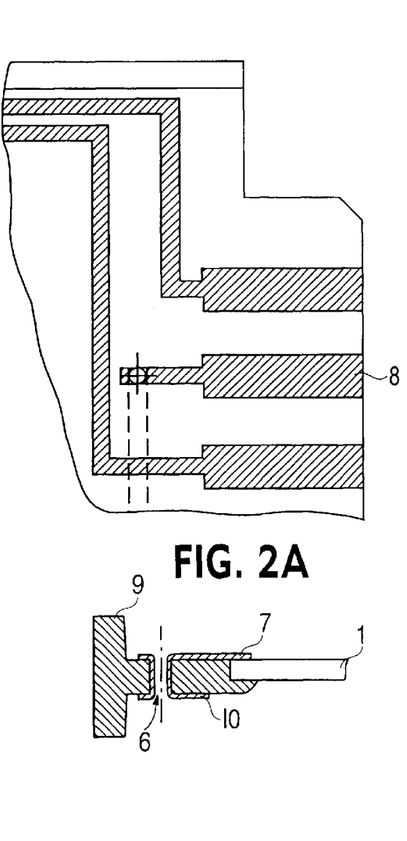

It is also possible a variant of manufacture a frameless group carrier (FIG. 2). In this case through apertures 6, disposed are formed instead hard metallic leads 4.

Simultaneously with the conductors 7 deposition to both sides of the carrier 3, the apertures 6 are metallized, connecting electrically the conductors 7, going from the dice 1 with bonding pads 10, disposed on the opposite side of the carrier 3.

In this case the connector 8 is formed and the conductors 7 deposited necessary for the burn-in and dice 1 checking are deposited also simultaneously.

After it necessary test equipment is connected to the group carrier through the connector's conventional socket, the carrier 3 is disposed in the heat chamber, the burn-in process and checking are made according to technical specifications of IC with the dice 1.

Figure 3:
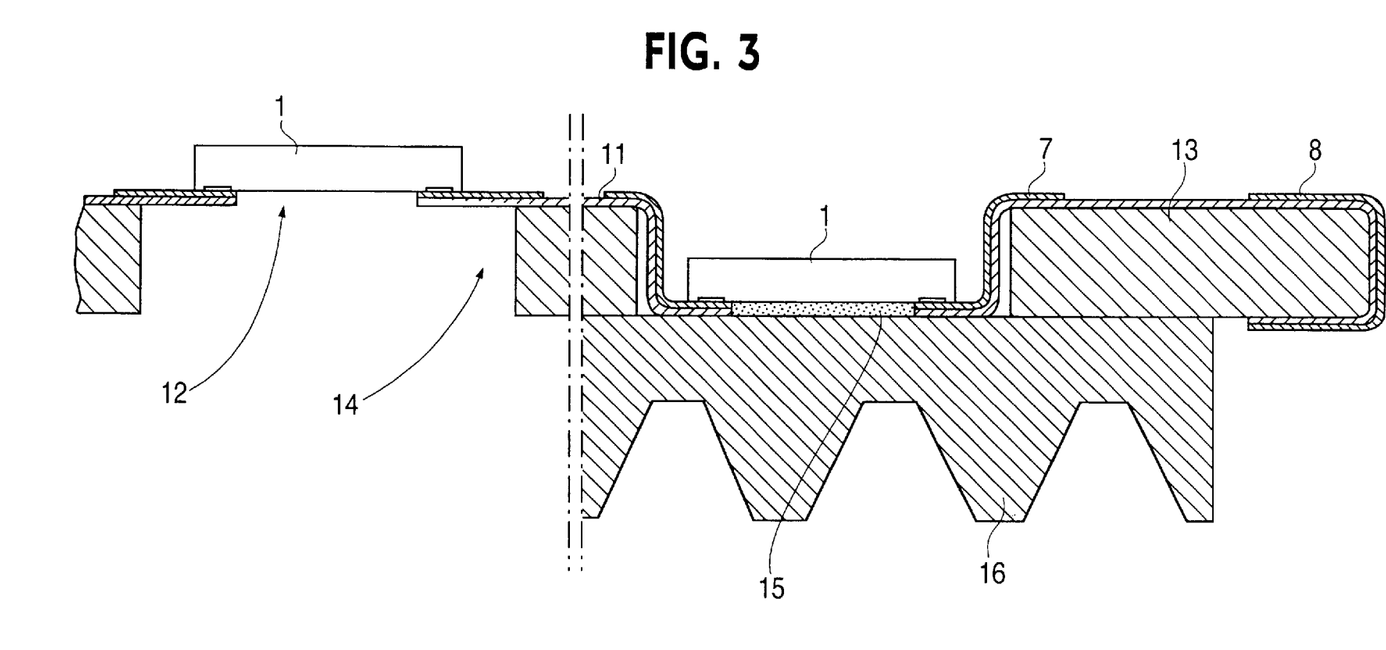
FIG. 3. Variant of a film group carrier applying the flexible PCB.

One of the group carrier's construction variant is shown in FIG. 3, applying a flexible PCB 11 with deposited conductors 7 on it. The die 1 preliminary is connected electrically with the conductors 7 by the bonding pads. A through aperture 12 in the flexible PCB 11 is made under the die 1. Leads of the external connector 8 are also formed on the flexible PCB 11, the board is bonded on one of the hard base's 13 borders and motionless connected to the border using, for example, gluing, forming the external flat connector 8 of the group carrier 3. Holes 14, necessary for making easier detachment of good components after the burn-in and checking, are provided in the base 13.

In the case when the processes of burn-in and checking take place with significant heat dissipation, it is possible to dispose the dice 1 inside the apertures 14, forming corresponding zones in the flexible PCB 11. In is case (shown at the right part of the FIG. 3) the die 1 through a heat conductive material 15 has a heat contact with external heat sink 16. The same decision is suitable also for constructions shown in the FIGS. 1, 2.

Figure 4:
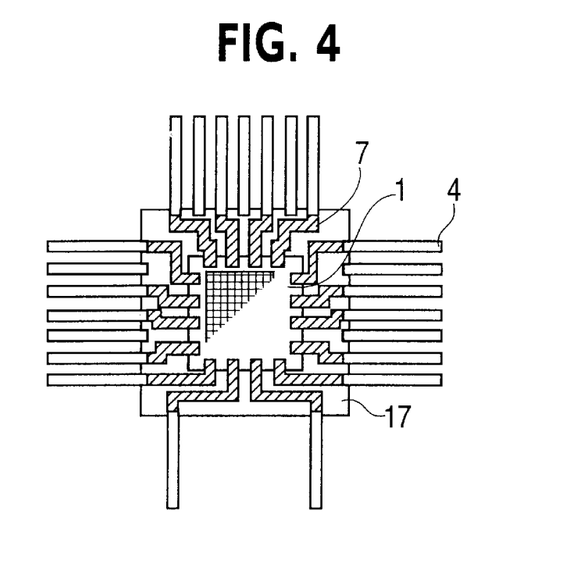
FIG. 4. Variant of the framed construction after detaching.
Figure 5:
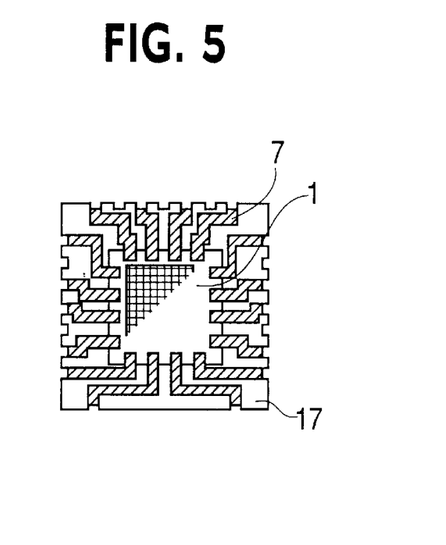
FIG. 5. Variant of the unframed construction after detaching.

After burn-in and checking the good dice 1 with zones of carrier 17 and leads 4 (see FIG. 4) are detached from the group carrier 3 using, for example, a method of cutting or a punch. In frameless variant (see FIG. 5) the good dice 1 with the carrier's zones 17 are also detached using, for example, method of through cutting via the middle of apertures 6, connecting the dice bonding pads with the leads bonding pads 10 of the carrier 3.

Figure 6:
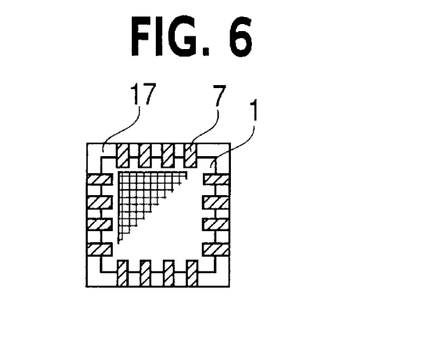
FIG. 6. Variant of a polymeric construction for housing in conventional packages.

In the case when the die 1 must be housed in a package for providing higher operation characteristics (see FIG. 6), the die 1 is also detached from the carrier 3, using, for example, the method of through cutting, remaining around the die 1 the carrier's zone 17, necessary for the die's safety and intactity. In the case the bonding pads 10 and through apertures 6, connecting them to the die's bonding pads are not made in the group carrier 3, and carrier's thickness is equal the die's 1 thickness.

Figure 7:
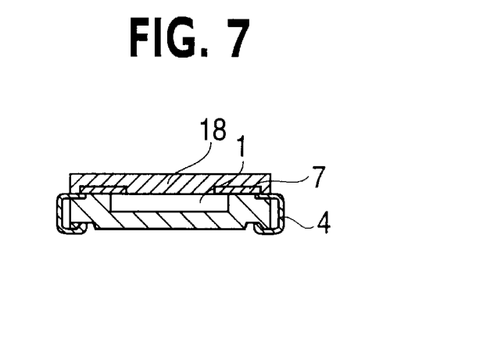
FIG. 7. IC using the framed variant of construction.

In order to obtain packaged IC having hard leads (see FIG. 7) metal leads 4 of the good die 1 are formed to have conventional size and a facial (main) part of the constructionally covered by a layer of polymeric material 18, using, for example, methods of pressing or molding by compound.

Figure 8:
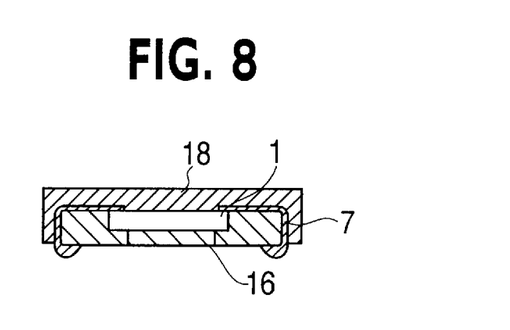
FIG. 8. IC using the unframed variant of construction.

In order to obtain packaged IC having deposited leads (see FIG. 8) the bonding pads 10 of the good die 1 are prolonged using, for example, galvanic method and further hot soldering. After it the facial (main) and edge parts of the construction are being covered by a layer of polymeric material 18.

Figure 9:
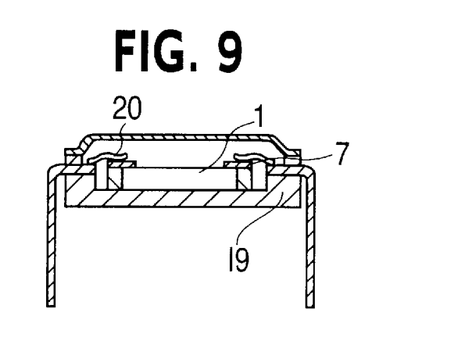
FIG. 9. IC in conventional package using the unframed variant of construction.

In order to have higher operation characteristics a known good die 1 with the carrier's zone 17 is housed, for example, into conventional ceramic package 19. (see FIG. 9), connection with external package's leads is made using welding by a wire 20.

Figure 10:
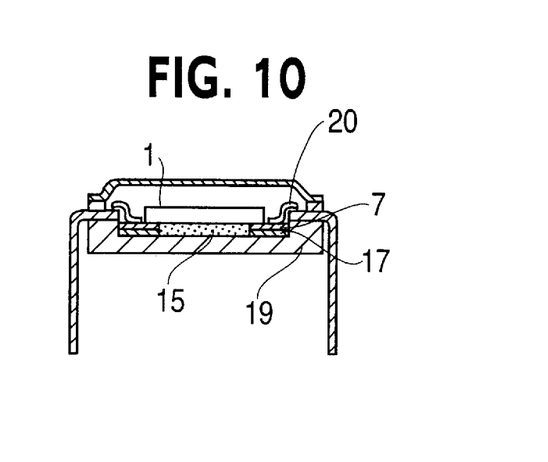
FIG. 10. IC in conventional package using the film variant of construction.

In similar case, when a component is detached from the flexible PCB 11 (see FIG. 10) and housed into conventional ceramic package, the welding by the wire 20 with conductors 7, disposed on the carrier's zone 17 takes place. In this case the die 1 is disposed by it's facial side down and has a heat contact with the package 19 through a heat conductive material 15, disposed inside on aperture 12 in the flexible PCB 11.

The present group method of manufacturing and checking electronic components is suitable for the burn-in and checking in practice all kind of semiconductor dice, it is high economic method, because it provides complete die's packaging after hermetization of it's main side. The method can be successfully applied for fabrication <<known good dice>> for further assembling by conventional methods. In the case of three-dimensional assemblies manufacture conductors, providing burn-in and checking and conductors, connecting elements inside microboards are deposited simultaneously, which gives additional profit. All the connections are made mainly using thin film technology, which makes the present method high reliable in comparison with conventional methods.

REFERENCES

1. U.S. Pat. No. 4,628,406 HO5K 1/11 1986.
2. U.S. Pat. No. 3,805,117 HO5K 1/04 1974
3. International Claim PCT WO 91/10259 HO1L 21/66 1990.
4. Europatent EP 0287451 HO1L 21/66 1988.
5. U.S. Pat. No. 4,996,630 HO5K 1/11 1991
6. U.S. Pat. No. 3,725,744 HO5 K 1/04 1973.
7. Europatent EP 0673193 HO5K 13/00 1995.
8. U.S. Pat. No. 4,242,720 HOK 1/04 1980.
9. Claim of Japan 63-65632 HO1L 21/50 1988.

What is claimed is:

1. Method of manufacturing and checking electronic components wherein:

a plurality of dice having bonding pads are arranged in a group carrier by disposing the dice in a press-form with their bonding pads being oriented to elements of the press-form and by then fixing the dice one to another by forming the group carrier of polymeric material in the press-form about the dice with the group carrier having a facial surface on a common plane with facial surfaces of the dice;

electrical connections are created to the dice by depositing an insulating layer on all electrically non-protected die zones, excluding the bonding pads and by depositing conductors on the common surface of the group carrier which thereby simultaneously connect the dice bonding pads with external contacts, connect the dice one to another, form an external connector of the group carrier and connect the dice with the external connector of the group carrier for providing burn-in and checking;

group burn-in processing and dice checking is carried out on the group carrier;

integrated-circuit components are detached from the group carrier, with each component including at least one good die and a separate zone of the carrier; and the thusly obtained component is housed in a package.

2. Method of manufacturing and checking electronic components according to claim 1, wherein, simultaneously with the dice being disposed in the press form, a group metal frame with leads for every die is also disposed in the press-form, the frame being simultaneously fixed with the dice, thereby forming the group carrier with the frame's leads being disposed on the same plane with the facial surfaces of the dice.

3. Method of manufacturing and checking electronic components according to claim 2, wherein open windows are provided in the group carrier in which leads of the group metal frame, intended for further connection to the dice bonding pads, are positioned.

4. Method of manufacturing and checking electronic components according to claim 3, wherein, during fabrication, windows with openings are made in the group carrier, a segment of the group frame is removed, and external contacts are made, while the electronic components are still in the group carrier form.

5. Method of manufacturing and checking electronic components according to claim 1, wherein the group carrier is made as a flexible printed circuit board, which is electrically connected with dice and has deposited conductors on it's surface, connecting the dice one to another and with an external connector of the group carrier, the external connector being formed by placing the flexible printed circuit board on a first surface of a hard base and bending the flexible printed circuit board about an edge of the hard base and fastening the flexible printed circuit board to the hard base.

6. Method of manufacturing and checking electronic components according to claim 5, wherein a through aperture is placed in the hard base, at which a good die with zones of flexible printed circuit board necessary for an electronic component is detached from the flexible printed circuit board.

7. Method of manufacturing and checking electronic components according to claim 5, wherein a through aperture is placed in the hard base and wherein the flexible printed circuit board is preliminarily formed to bend into the through aperture in the hard base to provide a common plane of a surface of the flexible printed circuit board with a second surface of the base.

8. Method of manufacturing and checking electronic components according to claim 1, wherein external leads of the component are formed by through metallized apertures in the group carrier and bonding pads, deposited on the group carrier's opposite side.

9. Method of manufacturing and checking electronic components according to claim 2, wherein good components, after burn-in, are detached from the group carrier, external leads are formed, the components are hermetized by applying polymeric material so that they become ICs, housed in polymeric packages.

10. Method of manufacturing and checking electronic components according to claim 1, wherein, after burn-in, good components are detached from the group carrier, hermetized by polymeric material and used as ICs, housed in thusly created polymeric packages.

11. Method of manufacturing and checking electronic components according to claim 1, wherein, after burn-in, good components are detached from the group carrier and used as known good die.

12. Method of manufacturing and checking electronic components according to claim 1, wherein an aperture is made in the group carrier and a heat conductive material is placed in the aperture with heat contact to a die and a heat sink before burn-in processing and dice checking.

* * * * *